(12) United States Patent
Ditri

(10) Patent No.: US 6,520,400 B2
(45) Date of Patent: Feb. 18, 2003

(54) WIRE TENSIONING APPARATUS

(75) Inventor: John Ditri, Huntingdon Valley, PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 100 days.

(21) Appl. No.: 09/822,070

(22) Filed: Mar. 30, 2001

(65) Prior Publication Data

US 2002/0139830 A1 Oct. 3, 2002

(51) Int. Cl.[7] .......................... B23K 31/02; B23K 37/00
(52) U.S. Cl. ...................................... 228/180.5; 228/4.5
(58) Field of Search .............................. 228/4.5, 180.5, 228/8, 103; 242/147 A

(56) References Cited

U.S. PATENT DOCUMENTS

| | | |
|---|---|---|
| 2,052,869 A | 9/1936 | Coanda |
| 4,019,669 A | 4/1977 | Tanimoto et al. |
| 4,266,710 A | 5/1981 | Bilane et al. |
| 4,498,638 A | 2/1985 | Kurtz et al. |
| 4,601,116 A | 7/1986 | Krimsky |
| 4,763,826 A | 8/1988 | Kulicke, Jr. et al. |
| 5,016,803 A | 5/1991 | Ohashi et al. |
| 5,031,821 A * | 7/1991 | Kaneda et al. ............ 228/110.1 |
| 5,067,509 A | 11/1991 | Hunter |
| 5,402,927 A * | 4/1995 | Frasch ...................... 228/180.5 |
| 5,564,616 A * | 10/1996 | Torihata et al. .......... 228/180.5 |
| 5,791,550 A * | 8/1998 | Kobayashi ................ 228/180.5 |
| 6,082,657 A * | 7/2000 | Chen et al. ............... 242/420.6 |
| 2001/0002031 A1 * | 5/2001 | Mochida et al. |

FOREIGN PATENT DOCUMENTS

| | | | |
|---|---|---|---|
| JP | 359068937 A | * | 4/1984 |
| JP | 403150852 A | * | 6/1991 |
| JP | 404011746 A | * | 1/1992 |
| JP | 407283264 A | * | 10/1995 |
| JP | 408340026 A | * | 12/1996 |

OTHER PUBLICATIONS

US 2001/0002031 A1 Mochida et al. (May 31, 2001).*

* cited by examiner

*Primary Examiner*—Tom Dunn
*Assistant Examiner*—Kiley Stoner
(74) *Attorney, Agent, or Firm*—RatnerPrestia

(57) ABSTRACT

A device and method for providing tension and a reserve wire reservoir to a bonding wire for use with a bonding machine. The device includes an outlet port providing fluid under pressure, and a surface along which the pressurized fluid flows in a direction away from the outlet port such that the bonding wire follows a path along the surface and the pressurized fluid places a uni-directional tension on the bonding wire while maintaining a reserve portion of wire in a slack loop.

23 Claims, 6 Drawing Sheets

WIRE TENSIONING APPARATUS

BACKGROUND OF THE INVENTION

The present invention relates to fine wire feeding mechanisms of the type used with automatic semiconductor wire bonders. More particularly, the present invention relates to a combined wire tensioning and slack reserve apparatus used in a wire feed mechanism of an automatic wire bonder.

DESCRIPTION OF THE RELATED ART

Automatic wire bonders are known in the semiconductor manufacturing industry. A commercially available processor controlled automatic wire bonder is made by Kulicke and Soffa Industries, Inc. (the assignee of the present invention) and is shown and described in U.S. Pat. No. 4,266,710.

Modern automated wire bonders employ a wire-feed system whose two primary purposes are to (a) ensure that wire is smoothly and continuously delivered from its spool to the bonding tool where the wire is continually being consumed by the bonding process and (b) place an upward tension force on the wire during certain portions of the bonding cycle to aid in seating the wire into the bonding capillary. These two requirements have conventionally been satisfied by employing two independent sub-systems of the wire feed system, one to ensure smooth continuous feeding of the wire and the other to apply tension to the wire.

To ensure smooth and continuous wire feeding, a "wire slack reservoir" or "air guide" of the type shown and described, for example, in U.S. Pat. Nos. 4,736,826 and 5,564,616 are usually employed. The main characteristic and operating principles of such conventional slack reservoirs are the supply of a pressurized fluid transverse to the direction of the wire from a nozzle, which is supplied with compressed fluid. The wire may be constrained between two closely spaced plates, forming a channel through which the fluid flows, or a single fluid/wire guiding surface may be used.

The flow of pressurized fluid transverse to the wire axis exerts a bi-directional tension force on the wire which, in turn, causes the wire to form a bent section or "loop", the size and shape of which depends upon the amount of fluid flow supplied to the device. As wire is consumed in the bonding process, the slack loop continually decreases in size at a rate dependant upon the amount of wire forming each bond as well as the number of bonds produced in unit time.

One or more sensors (optical or other type) are typically employed in slack reservoir systems to sense the decreasing wire loop, and to re-supply the reservoir and re-establish a full-sized loop with additional wire from the wire supply spool. There is typically an electronic communication and synchronization between the sensor(s) and a motor to which the wire spool is attached for coordination of wire spool rotation and wire slack loop re-supply. In this way, wire is continuously supplied to the bonder when required and no supply occurs when the bonder is idle.

One undesirable feature of conventional wire slack systems, which employ transverse fluid flows, is that in producing the wire loop, a bi-directional tension is also supplied to the wire. The actual amount of tension depends upon the amount of fluid flow supplied to the device as well as on the loop shape, or amount of slack reserve in the unit. This variable tension is undesirable because during the bonding process, the wire slack loop naturally shrinks and grows in size, and hence, a variable amount of tension is applied to the wire during bonding. This variable component of tension is in addition to the steady tension supplied by the separate tensioner unit. Varying tension leads to undesirable bonding results such as variable loop heights and potentially tight (abnormally low) loops. The sensitivity of conventional transverse flow systems to the loop size and shape can be severe.

The second component of conventional wire feed systems is a wire tensioner, the primary purpose of which is to supply a steady, pre-determined amount of tension to the wire during parts of the wire bond cycle. The amount of tension is typically adjustable by the amount of pressurized fluid which is supplied to the tensioner.

Most modern wire bonders utilize a tensioning system composed of a series of small hollow tubes, stacked end to end, and housed in an enclosing plenum structure. The wire is threaded through the inner surfaces of the multiple tubes.

In alternate types of systems, compressed fluid is either forced through the tubes (pressure type) or drawn in from the tubes (vacuum type) to establish a fluid flow through the tubes. The movement of this fluid flow along the wire produces a tension force on the wire through viscous and pressure type forces. The directionality of the tension force produced on the wire is ensured by making the inside diameters of the various tubes in the stack larger or smaller, thus presenting the fluid with a higher and lower resistance path. The predominant tension is produced on the wire by the fluid which flows along the low resistance path of the tensioner. Typical inner diameters for tensioner tubes can range from 0.020 inches for the low resistance path to 0.005 inches for the high resistance path.

Tensioners as described above have been used on automated wire bonders for many years and are commercially available. While these types of tensioners have proven convenient, they have a number of drawbacks which are becoming more and more apparent as the diameter of the wire used in wire bonding continues to shrink. Some of the known disadvantages of these conventional tensioning systems are:

a) Difficulty in threading the small diameter wire through the multiple tubes of the tensioner. When the wire encounters any sharp edge along the inner surfaces of the tubes, or interfaces between adjoining tubes, it has a tendency to bend. Because of the small inner diameters required for proper operation of the tensioner, the bent wire can no longer fit through the tubes and threading is prevented.

b) Fluid flow through the tensioner tubes, as well as the action of bonding, causes the wire to thrash back and forth and move up and down within the tensioner tubes. Because of this physical contact between the wire and the inner surfaces of the tensioner tubes, extremely smooth surface finishes are required on the inner surfaces of the tubes to prevent scratches from damaging the surface of the relatively soft bonding wire. It is very difficult however, to polish interior surfaces, especially cylindrical holes of dimensions typical of tensioner tubes and this relates to either inferior tubes which do indeed damage the wire, or prohibitively expensive tubes which posses the required surface interior surface finishes.

c) Inside surfaces of the tubes tend to become contaminated with time and/or usage due to the continual passage of wire through the tensioner tubes, as well as the flow of fluid. Cleaning such small tubes is difficult because of the restricted access to the inside surfaces.

Typically, immersion in a cleaning solvent in an ultrasonic cleaner is required to properly clean the tubes. This is a time consuming process, which requires specialized equipment, and the need for disassembly and re-assembly can lead to occasional lost or damaged parts.

d) Conventional tube tensioning systems tend to produce an undesirable twisting moment on the wire in addition to the desired upwards tension. The origin of the twist force is not fully understood, but it is believed to originate from fluid swirling in a vortex motion within the tubes. The net result of the twisting force is a physical twisting or spinning of the wire during bonding. This leads to a condition known as "leaning wire". In its severest form, leaning wires can touch one another and cause electrical shorting of the device being bonded.

Accordingly, it would be desirable to provide a uni-directional tensioning device that will virtually eliminate known problems associated with convention bonding wire tensioning systems.

SUMMARY OF THE INVENTION

In view of the shortcomings of the prior art, the present invention is directed towards removing the known limitations and significantly enhancing the performance and ease of use of existing wire-feed systems. The present invention is a device for simultaneously providing both a slack reserve loop of bonding wire and for providing a uni-directional upward tension on the wire without the known deficiencies of conventional wire feed system components.

The device includes an outlet port providing fluid under pressure, and an adjacent, continuously or stepped (piecewise linear) curved, surface to which the exhaust jet adheres through pressure and viscous drag forces. As the exhaust fluid is diverted along the surface, it develops into a highly accelerated, high velocity, low-pressure fluid jet which flows substantially along the guiding surface. The bonding wire is trapped by the low pressure within the exhaust jet and essentially follows the flow. The flow of high velocity fluid along the wire produces a uni-directional tension on it in the direction of the flow.

At the same time, because the wire is constrained by other surfaces of the device, the exhaust fluid is forced to flow transverse to a portion of the wire, creating a reserve loop. However, because most of the tension produced on the wire comes from the high velocity fluid flow which immediately adjacent to the exhaust nozzle, the tension force is much less sensitive to the amount of wire in the slack loop than conventional slack loop systems.

According to another aspect of the invention, a tensioning unit includes a fluid inlet port; a fluid reservoir coupled to the fluid inlet port; a fluid outlet port coupled to the fluid reservoir, the fluid flowing through the outlet port under pressure; a surface having a first end adjacent the outlet port, the pressurized fluid flowing along the surface from the first end and toward a second end of the surface, such that the pressurized fluid provides a uni-directional tension to a bonding wire following the surface of the tensioning unit.

According to yet another aspect of the invention, the surface includes a first curved portion at the first end; and a substantially linear portion coupled to the curved portion, such that the fluid exits the outlet port and follows the curved portion and a portion of the linear portion of the surface.

According to a further aspect of the invention, a method for provided a uni-directional tension to a bonding wire is disclosed. The method comprising the steps of providing a fluid to a reservoir; pressurizing the fluid; providing a curved surface adjacent the reservoir; and ejecting the pressurized fluid from the reservoir in a first direction along the curved surface, such that the bonding wire follows a path along the surface and the pressurized fluid provides a uni-directional tension to the bonding wire.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION

Figure 1:
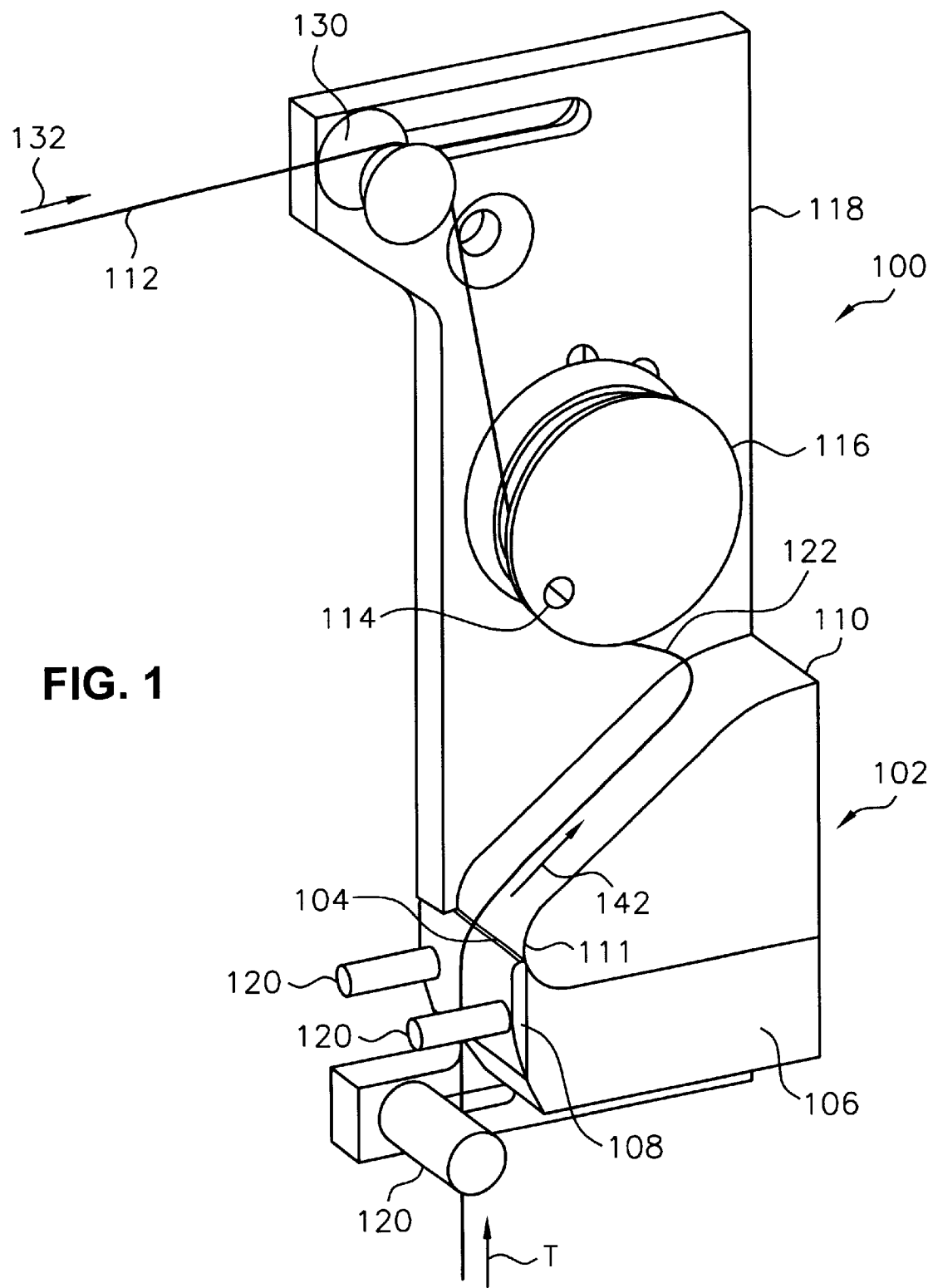
FIG. 1 is a perspective illustration of an exemplary embodiment of the present invention.

Referring to FIG. 1, an exemplary embodiment of the present invention is shown. In FIG. 1, tensioning device 100 is mounted on a wire bonding machine (not shown) via mounting plate 118, for example. Tensioning device 100 includes a wire tensioning unit 102 and diverter 130 for changing the direction of bonding wire 112 from the wire spool (not shown) toward a bonding tool (not shown). In the exemplary embodiment, bonding wire 112 feeds from the wire spool in a generally horizontal direction 132 and diverter 130 redirects bonding wire 112 toward wire tensioning unit 102 in a generally vertical direction. If necessary, diverter 130 may move along slot 131 as bonding wire 112 is provided to the bonding tool, or may be fixed in a position along slot 131 to vary the angle of bonding wire 112 relative to sensor holder 116. Tensioning device 100 also includes wire sensor holder 116 (having an optical sensor 114, for example) for determining whether the bonding wire is present and wire guides 120 for guiding bonding wire 112 toward the bonding tool (not shown).

Tensioning unit 102 includes nozzle body 106, outlet port 104, faceplate 108 and Coanda surface 110. Fluid 124 (shown in FIG. 3), such as air for example, exits outlet port 104 under pressure and follows along Coanda surface 110 according to the Coanda effect and provides a uni-directional tension T to bonding wire 112 in direction 142 toward the source of the bonding wire and away from the bonding tool. In the exemplary embodiment, the opening gap of outlet port 104 is about 0.008 in. This dimension may be adjusted, however, as desired based on other factors, such as the pressure of fluid 124, the width of outlet port 104, the radius R of lower portion 111 of Coanda surface 110 (shown in FIG. 2), and the size of the bonding wire 112. In the exemplary embodiment, the width of outlet port 104 is about as wide as Coanda surface 110. This width is preferably less that the width of Coanda surface 110, however, and most preferably about 70% the width of Coanda surface 110.

Figure 2:
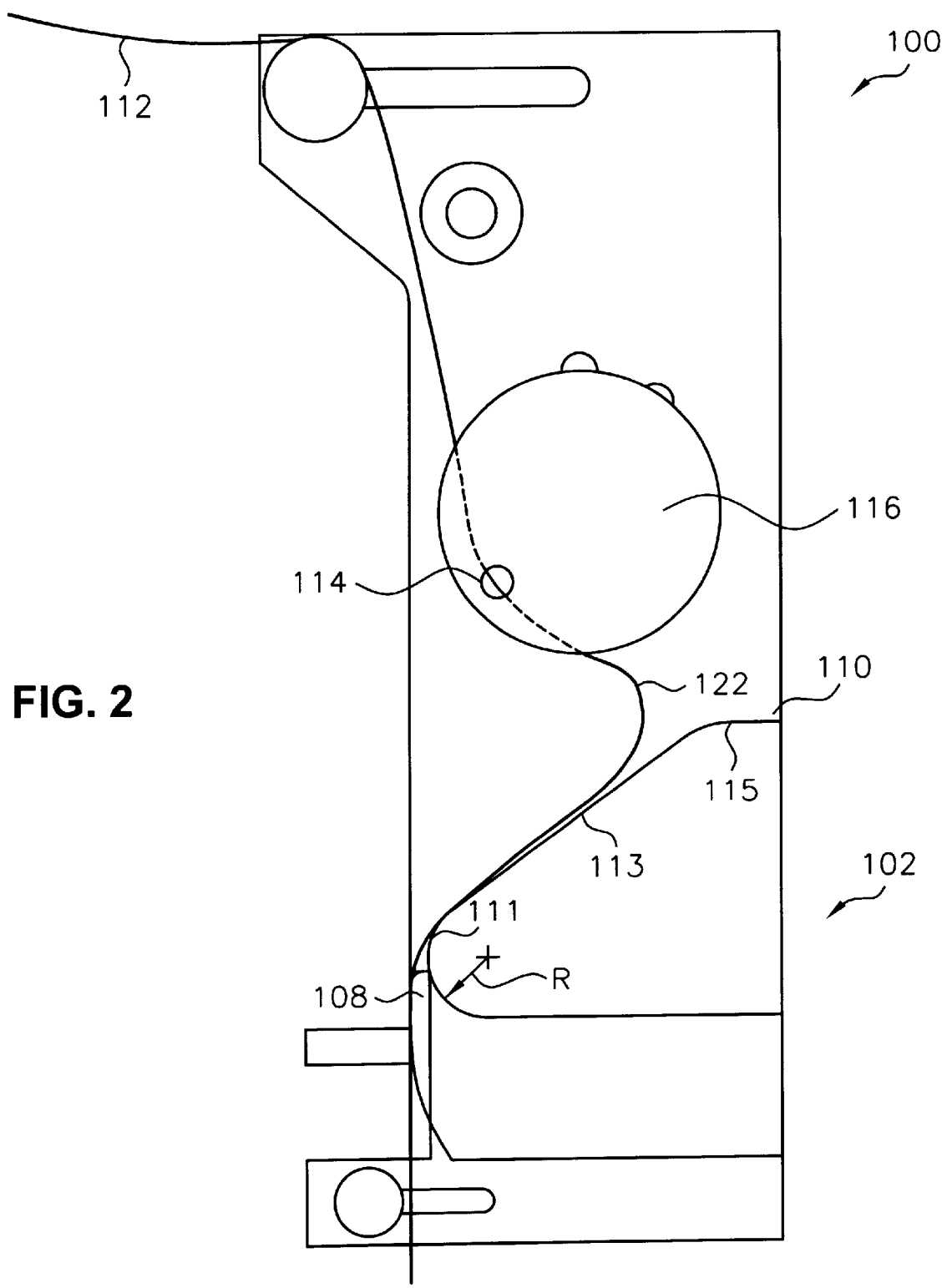
FIG. 2 is a front view of the embodiment of FIG. 1.

FIG. 2 is a front view of the exemplary embodiment shown in FIG. 1. In FIG. 2 the relationship of bonding wire 112 to Coanda surface 110 is illustrated. As bonding wire 112 feeds toward the bonding tool through sensor holder 116, it forms a reserve loop 122. Bonding wire 112 then generally follows Coanda surface 110 along middle portion 113 and lower portion 111, faceplate 108 and further toward the bonding tool. As shown in FIG. 2, the exemplary Coanda surface 110 consists of a lower portion 111 having a generally curved shape with radius R, a generally flat portion 113 and a slightly curved upper portion 115. In the exemplary embodiment, radius 111 is about 0.200 in. Although radius R may be adjusted as desired, it is important not to allow lower surface 111 to become too sharp (i.e., radius R is too small) as this will effect the ability of pressurized fluid 124 to "wrap" around the Coanda surface 110.

Figure 3:
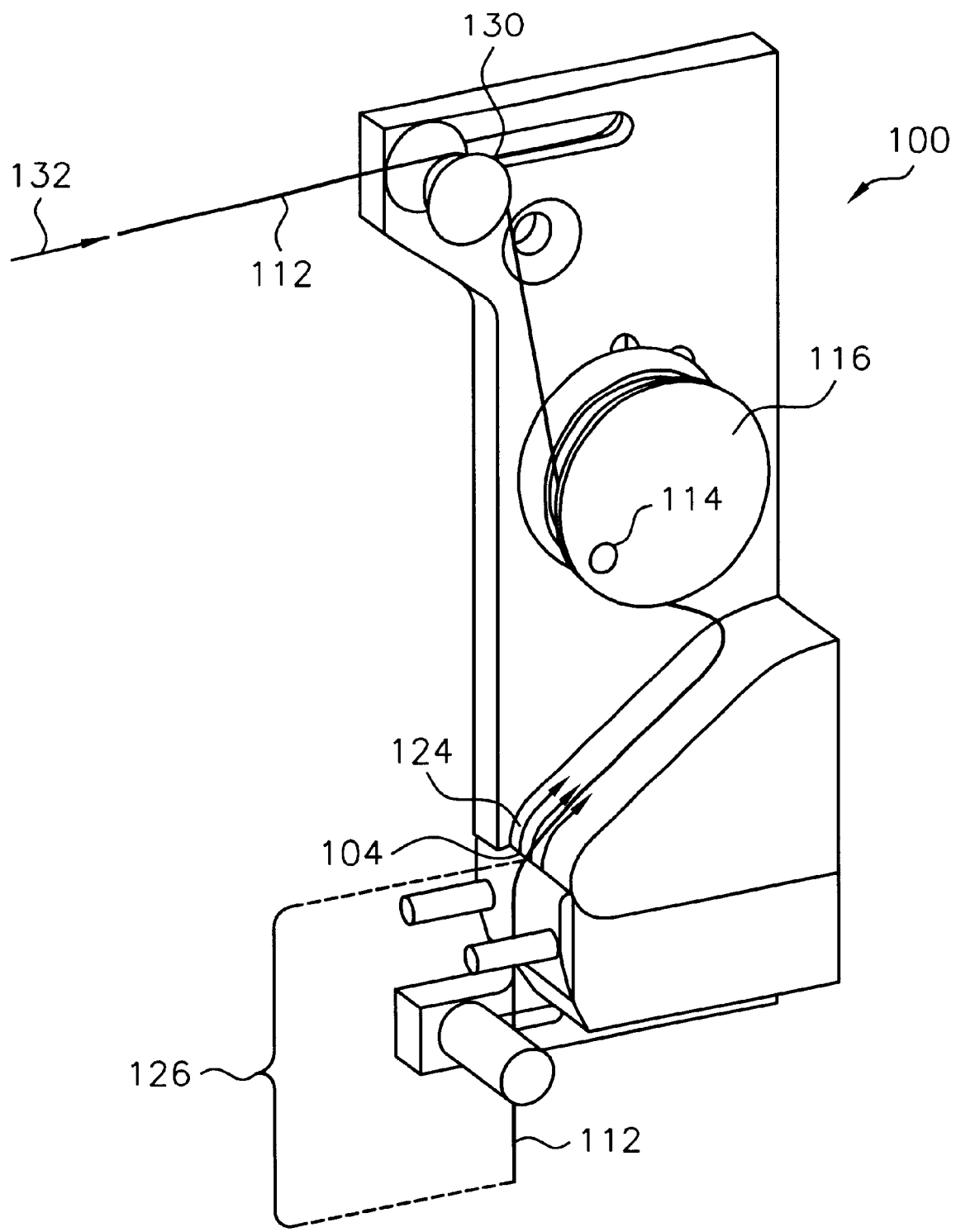
FIG. 3 is another perspective view of the exemplary embodiment of FIG. 1 illustrating the flow of pressurized fluid.
Figure 4:
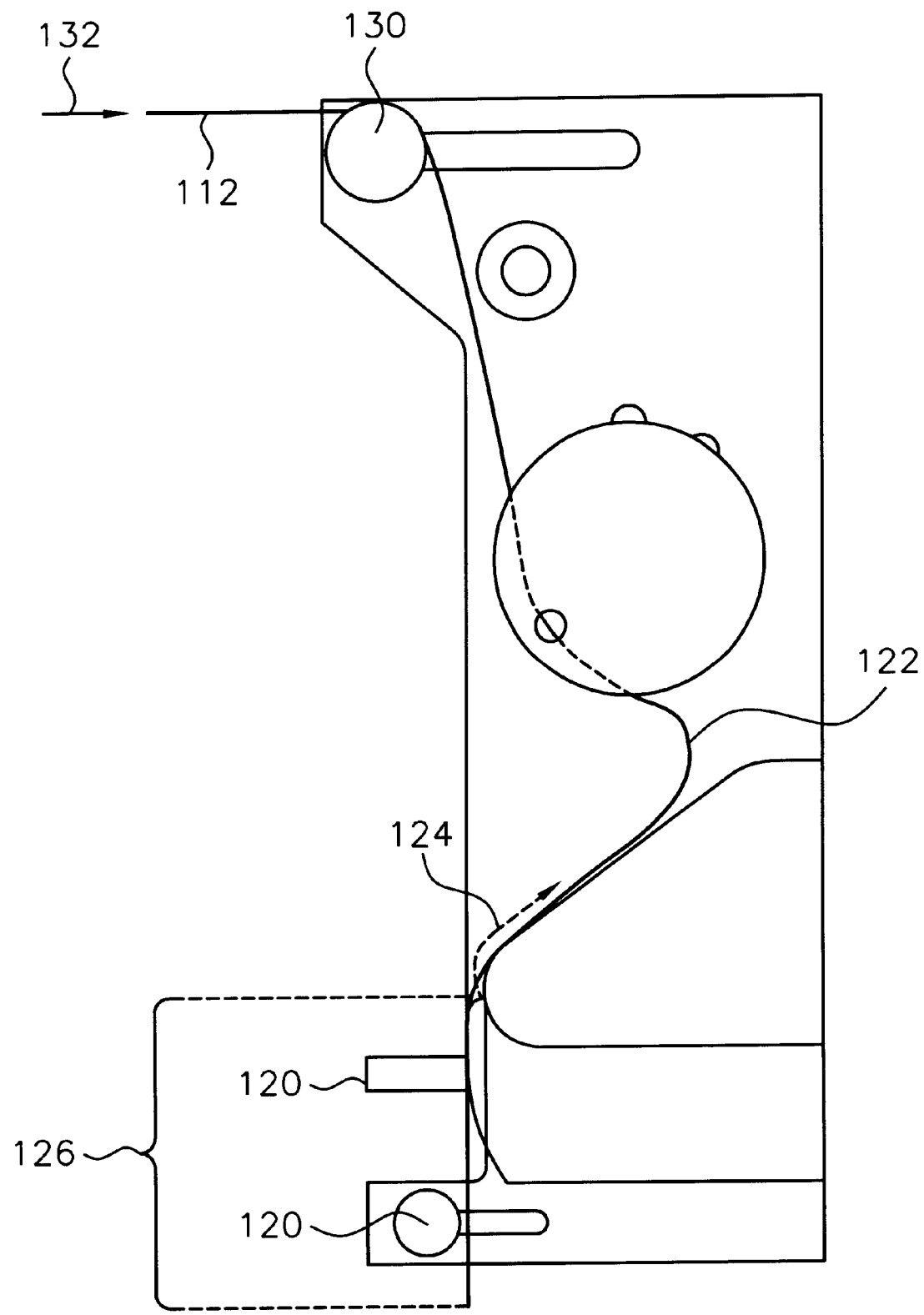
FIG. 4 is a front view of the embodiment illustrated in FIG. 3.

FIGS. 3 and 4 are a perspective view and side view, respectively, of tensioning tool 100 illustrating the flow of pressurized fluid 124 for placing tension T on bonding wire 112 along portion 126 of bonding wire 112 which leads to the bonding tool.

Figure 5:
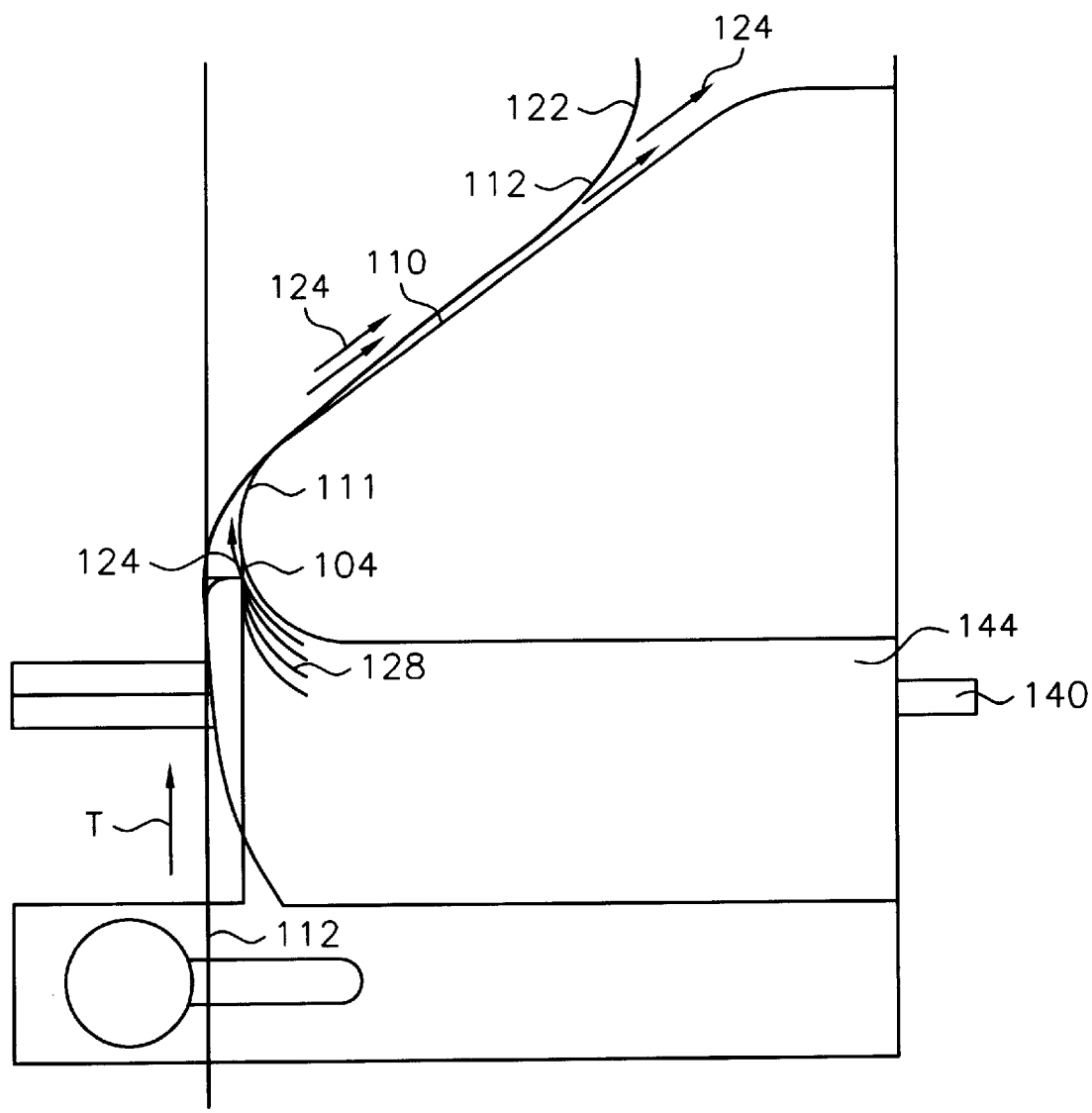
FIG. 5 is a partial side view of the embodiment illustrated in FIG. 3 detailing the flow of pressurized fluid.

FIG. 5 is a detailed partial side view of tensioning unit 100. In FIG. 5, a source of pressurized fluid (not shown) is coupled to inlet port 140 which, in turn, is coupled to fluid reservoir 144. The pressure of fluid 128 contained within reservoir 144 may be adjusted as required either via an external or internal regulator (not shown). Fluid 128 exits reservoir 144 through outlet port 104 as pressurized fluid 124, and, according to the Coanda effect, follows Coanda surface 110 and, in turn, places uni-directional tension T on bonding wire 112. The tension produced on bonding wire 112 comes predominantly from the high velocity fluid in the vicinity of the lower portion of the Coanda surface 111. In addition, a slight amount of tension also comes from the fluid force on slack loop 122.

Figure 6:
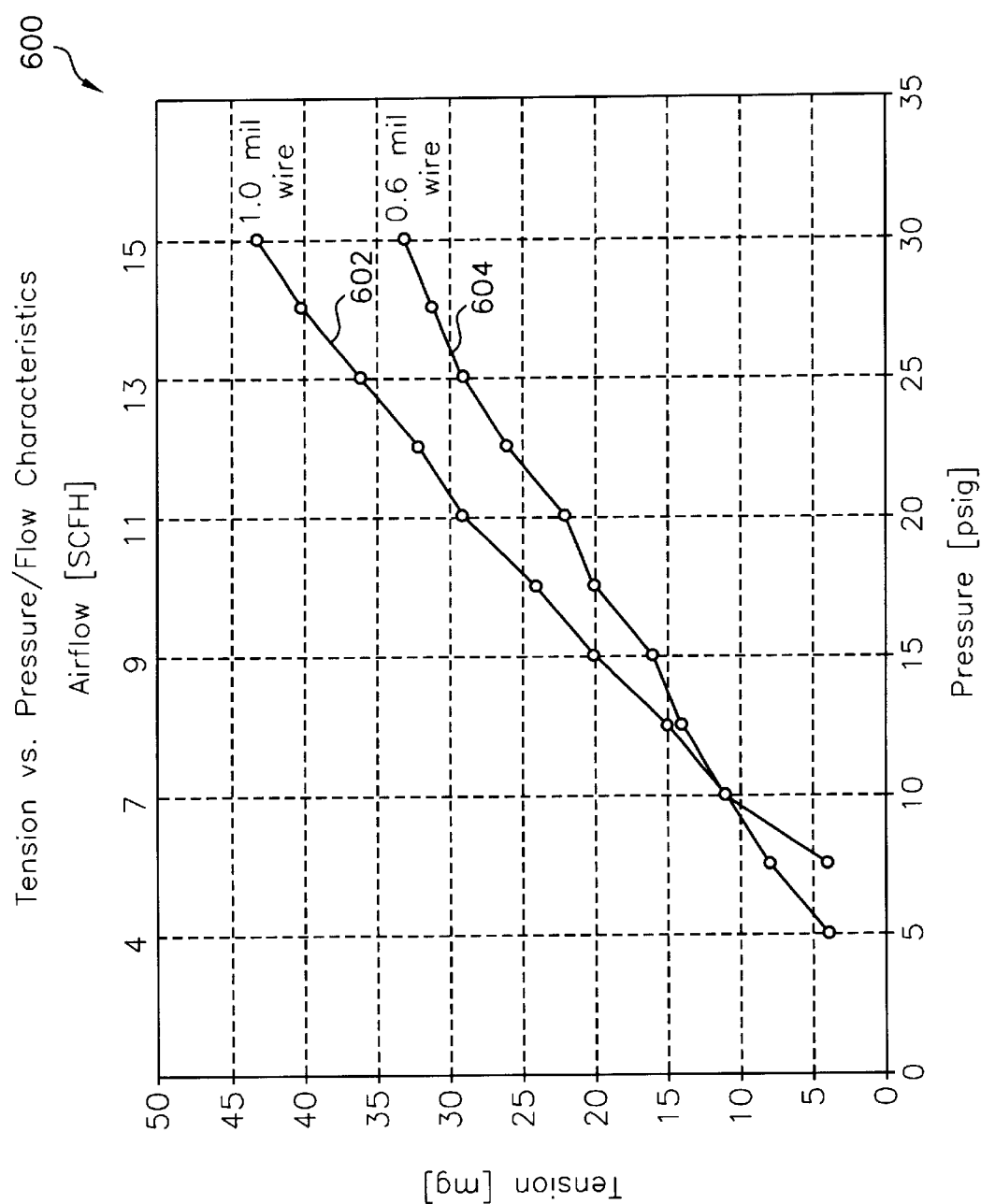
FIG. 6 is a graph illustrating the tension versus pressure characteristics of an exemplary embodiment of the present invention.

FIG. 6 is a graph 600 of tension versus pressure for bonding wires of various diameters. As shown in FIG. 6, the tension placed on the bonding wire is greater for a larger wire when the pressure of the fluid is 10 psig or greater. Curve 602 is illustrative of a 0.001 in. diameter bonding wire while curve 604 is illustrative of a 0.0006 in. diameter bonding wire. Curves 602, 604 are representative of outlet port 104 having a height of about 0.008 in. and a Coanda surface radius 111 of about 0.200 in. It should be noted that the amount of compressed air required for operating the present device is considerably lower than that required to provide an equivalent amount of tension using conventional vacuum type tube tensioners. In conventional vacuum tensioners, an air flow of roughly 90 SCFH (1.5 SCFM) would be required to achieve the same 35 milligram force as the current invention provides with only 15 SCFH. This represents compressed air savings of over 80%.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A method for providing tension to a bonding wire for use with a wire bonding machine, the method comprising the steps of:

providing a fluid to a reservoir;
pressurizing the fluid;
providing a curved surface adjacent the reservoir; and
ejecting the pressurized fluid from the reservoir in a first direction along the curved surface,
wherein the bonding wire follows a path along the surface and the pressurized fluid provides a uni-directional tension to the bonding wire.

2. A device for providing tension to a bonding wire for use with a wire bonding machine, the device comprising:

an outlet port providing fluid under pressure, and
a surface along which the pressurized fluid flows in a direction away from the outlet port,
wherein the bonding wire follows a path along the surface and the pressurized fluid provides a uni-directional tension to the bonding wire.

3. A device according to claim 2, wherein the uni-directional tension is in a direction of the fluid flow.

4. A device according to claim 2, wherein the surface includes a curved portion adjacent the outlet port.

5. A device for providing tension to a bonding wire, the device comprising:

a tensioning unit including:
an outlet port providing fluid under pressure, and
a surface along which the pressurized fluid flows in a direction away from the outlet port,
wherein the bonding wire follows a path along the surface of the tensioning unit and the pressurized fluid provides a substantially uni-directional tension to the bonding wire.

6. A device according to claim 5, further comprising a sensor to determine whether the bonding wire is present in the tensioning unit.

7. A device according to claim 6, wherein the bonding wire forms a reserve slack loop adjacent one end of the surface.

8. A device according to claim 7, wherein the reserve slack loop is positioned between the surface and the sensor.

9. A device according to claim 5, wherein a pressure of the fluid is adjustable.

10. A device according to claim 5, further comprising a wire guide coupled to the tensioning unit to guide the bonding wire to a bonding tool.

11. A device according to claim 5, further comprising a reservoir containing the pressurized fluid.

12. A device according to claim 5, wherein the pressurized fluid follows the surface of the tensioning unit in a direction toward a source of the bonding wire.

13. A device according to claim 5, wherein the fluid is a gas.

14. A device according to claim 13, wherein the gas is air.

15. A device according to claim 5, wherein the pressurized fluid flows through an orifice of the outlet port.

16. A device according to claim 15, wherein the orifice has a height of about 0.008 in.

17. A device according to claim 5, wherein the surface has a first curved portion at a first end thereof.

18. A device according to claim 17, wherein the curved portion has a radius of about 0.200 in.

19. A device according to claim 18, further comprising:

a source of bonding wire,
a supply guide coupled to the tensioning unit to guide the bonding wire from the source of the bonding wire to the tensioning unit;
a wire sensor to determine whether the bonding wire is present in the tensioning unit; and a wire guide coupled to the tensioning unit to guide the bonding wire to the bonding tool.

20. A device for use with a wire bonding tool, the device comprising:
a tensioning unit including:
a fluid inlet port;
a fluid reservoir coupled to the fluid inlet port;
a fluid outlet port coupled to the fluid reservoir, the fluid flowing through the outlet port under pressure; and
a surface having a first end adjacent the outlet port, the pressurized fluid flowing along the surface from the first end and toward a second end of the surface,
wherein the pressurized fluid provides a uni-directional tension to a bonding wire following the surface of the tensioning unit.

21. A device according to claim 20, wherein the outlet port has a height of about 0.008 in.

22. A device according to claim 20, wherein the surface comprises:
a first curved portion at the first end; and
a substantially linear portion coupled to the curved portion,
wherein the fluid exits the outlet port and follows the curved portion and at least a portion of the linear portion of the surface.

23. A device according to claim 22, wherein the curved portion has a radius of about 0.200 in.

\* \* \* \* \*